(12) United States Patent
Kawasaki et al.

(10) Patent No.: US 10,998,283 B2
(45) Date of Patent: May 4, 2021

(54) SEMICONDUCTOR DEVICE PRODUCTION METHOD

(71) Applicant: TOSHIBA MEMORY CORPORATION, Tokyo (JP)

(72) Inventors: Takahiko Kawasaki, Aichi (JP); Yukiteru Matsui, Aichi (JP); Akifumi Gawase, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/289,644

(22) Filed: Feb. 28, 2019

(65) Prior Publication Data

US 2020/0035636 A1 Jan. 30, 2020

(30) Foreign Application Priority Data

Jul. 26, 2018 (JP) .............................. JP2018-140537

(51) Int. Cl.
*H01L 23/00* (2006.01)
*H01L 25/18* (2006.01)
*H01L 25/00* (2006.01)

(52) U.S. Cl.
CPC .............. *H01L 24/27* (2013.01); *H01L 24/03* (2013.01); *H01L 24/05* (2013.01); *H01L 24/08* (2013.01); *H01L 24/29* (2013.01); *H01L 24/32* (2013.01); *H01L 24/83* (2013.01); *H01L 24/92* (2013.01); *H01L 24/94* (2013.01); *H01L 25/18* (2013.01); *H01L 25/50* (2013.01); *H01L 2224/03616* (2013.01); *H01L 2224/05166* (2013.01); *H01L 2224/05181* (2013.01);
(Continued)

(58) Field of Classification Search
None
See application file for complete search history.

(56) References Cited

U.S. PATENT DOCUMENTS 6,326,299 B1 * 12/2001 Homma ................... C09G 1/02
257/E21.304
6,387,190 B1 5/2002 Aoki et al.
(Continued)

FOREIGN PATENT DOCUMENTS

JP 2001-257188 A 9/2001
JP 2008-153571 A 7/2008
(Continued)

*Primary Examiner* — Nicholas J Tobergte
*Assistant Examiner* — Kien C Ly
(74) *Attorney, Agent, or Firm* — Foley & Lardner LLP

(57) ABSTRACT

A semiconductor device production method includes forming a first recess portion in a first insulating film formed on a first substrate and a first conductive layer on the front surface of the first insulating film located inside and outside the first recess portion. In the first recess portion, a first pad is formed having a width of 3 μm or less and including the first conductive layer by performing a first polishing the first conductive layer at a first polishing rate and, after the first polishing, a second polishing the first conductive layer at a second polishing rate lower than the first polishing rate. The first pad of the first substrate and a second pad of a second substrate are joined together by annealing the first substrate and the second substrate. The selection ratio of the first conductive layer to the first insulating film is 0.3 to 0.4.

10 Claims, 6 Drawing Sheets

(52) U.S. Cl.
CPC ............... *H01L 2224/05647* (2013.01); *H01L 2224/08145* (2013.01); *H01L 2224/27616* (2013.01); *H01L 2224/29186* (2013.01); *H01L 2224/32145* (2013.01); *H01L 2224/80006* (2013.01); *H01L 2224/80815* (2013.01); *H01L 2224/83005* (2013.01); *H01L 2224/83012* (2013.01); *H01L 2224/83026* (2013.01); *H01L 2224/8389* (2013.01); *H01L 2224/83896* (2013.01); *H01L 2224/9211* (2013.01); *H01L 2224/92142* (2013.01); *H01L 2924/1431* (2013.01); *H01L 2924/14511* (2013.01); *H01L 2924/20106* (2013.01); *H01L 2924/20107* (2013.01)

(56) References Cited

U.S. PATENT DOCUMENTS

| | | |
|---|---|---|
| 9,849,558 B2 | 12/2017 | Nakayama et al. |
| 2003/0322920 | 2/2003 | Noguchi |
| 2004/0048478 A1* | 3/2004 | Cheng ................. H01L 21/3081 438/690 |
| 2009/0278080 A1* | 11/2009 | Ohta ....................... C09G 1/02 252/79.1 |
| 2014/0175655 A1* | 6/2014 | Chen ....................... H01L 24/05 257/762 |
| 2017/0259399 A1 | 9/2017 | Watanabe et al. |

FOREIGN PATENT DOCUMENTS

| | | |
|---|---|---|
| JP | 4657408 B2 | 3/2011 |
| JP | 2016-153152 A | 8/2016 |
| JP | 2017-162928 A | 9/2017 |

* cited by examiner

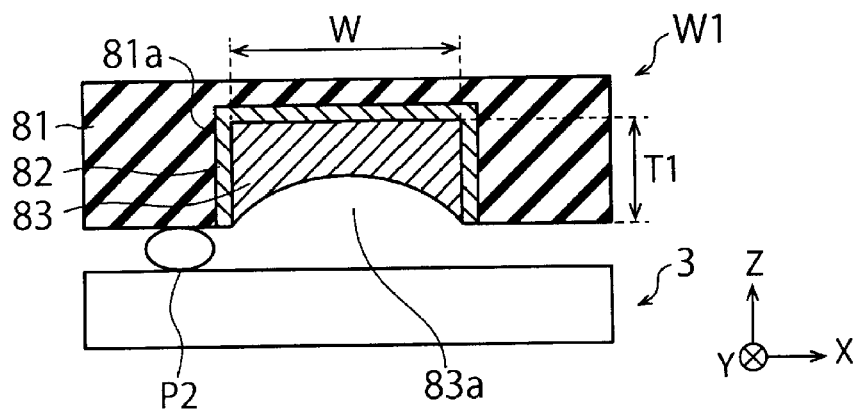
FIG. 5A
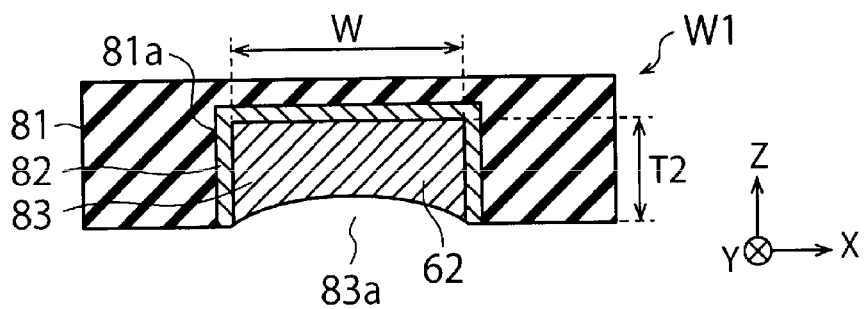
FIG. 5B
FIG. 6
| SELECTION RATIO | 0.77 | 0.54 | 0.37 | 0.27 |
|---|---|---|---|---|
| AMOUNT OF DISHING | 7 | 5 | 3 | -8 |
| BONDING AREA | 10 | 50 | 89 | 90 |

| pH | 2～3 | 11～12 |
|---|---|---|
| AFTER BONDING | VOID OCCURS | NO VOID OCCURS |

SEMICONDUCTOR DEVICE PRODUCTION METHOD

CROSS-REFERENCE TO RELATED APPLICATION

This application is based upon and claims the benefit of priority from Japanese Patent Application No. 2018-140537, filed on Jul. 26, 2018, the entire contents of which are incorporated herein by reference.

FIELD

Embodiments described herein relate generally to semiconductor device production methods.

BACKGROUND

A semiconductor device such as a three-dimensional memory is sometimes produced by joining a metal pad of a wafer and a metal pad of another wafer together by a bonding process. In this case, there is a possibility that, when, for example, the metal pads are polished by chemical mechanical polishing (CMP) and dishing remains in the metal pads, the metal pads are not properly joined together. Examples of related art include JP-A-2016-153152 and JP-A-2017-162928.

DESCRIPTION OF THE DRAWINGS

FIGS. 5A and 5B are sectional views (2/2) showing the details of the semiconductor device production method of the first embodiment;

FIG. 6 is a table for explaining the semiconductor device production method of the first embodiment;

DETAILED DESCRIPTION

Embodiments provide a semiconductor device production method that can properly join pads together.

In general, according to one embodiment, a semiconductor device production method includes: forming a first recess portion in a first insulating film formed on a first substrate; and forming a first conductive layer on the front surface of the first insulating film located inside and outside the first recess portion. The method further includes forming, in the first recess portion, a first pad having a width of 3 µm or less and including the first conductive layer by performing a first process of polishing the first conductive layer at a first polishing rate and, after the first process, a second process of polishing the first conductive layer at a second polishing rate which is lower than the first polishing rate. The method further includes joining the first pad of the first substrate and a second pad of a second substrate together by annealing the first substrate and the second substrate. Furthermore, the second process is performed in such a way that the selection ratio (e.g., a ratio between polishing rates of target materials) of the first conductive layer to the first insulating film is 0.3 to 0.4.

Hereinafter, an embodiment will be described with reference to the drawings.

First Embodiment

Figure 1:
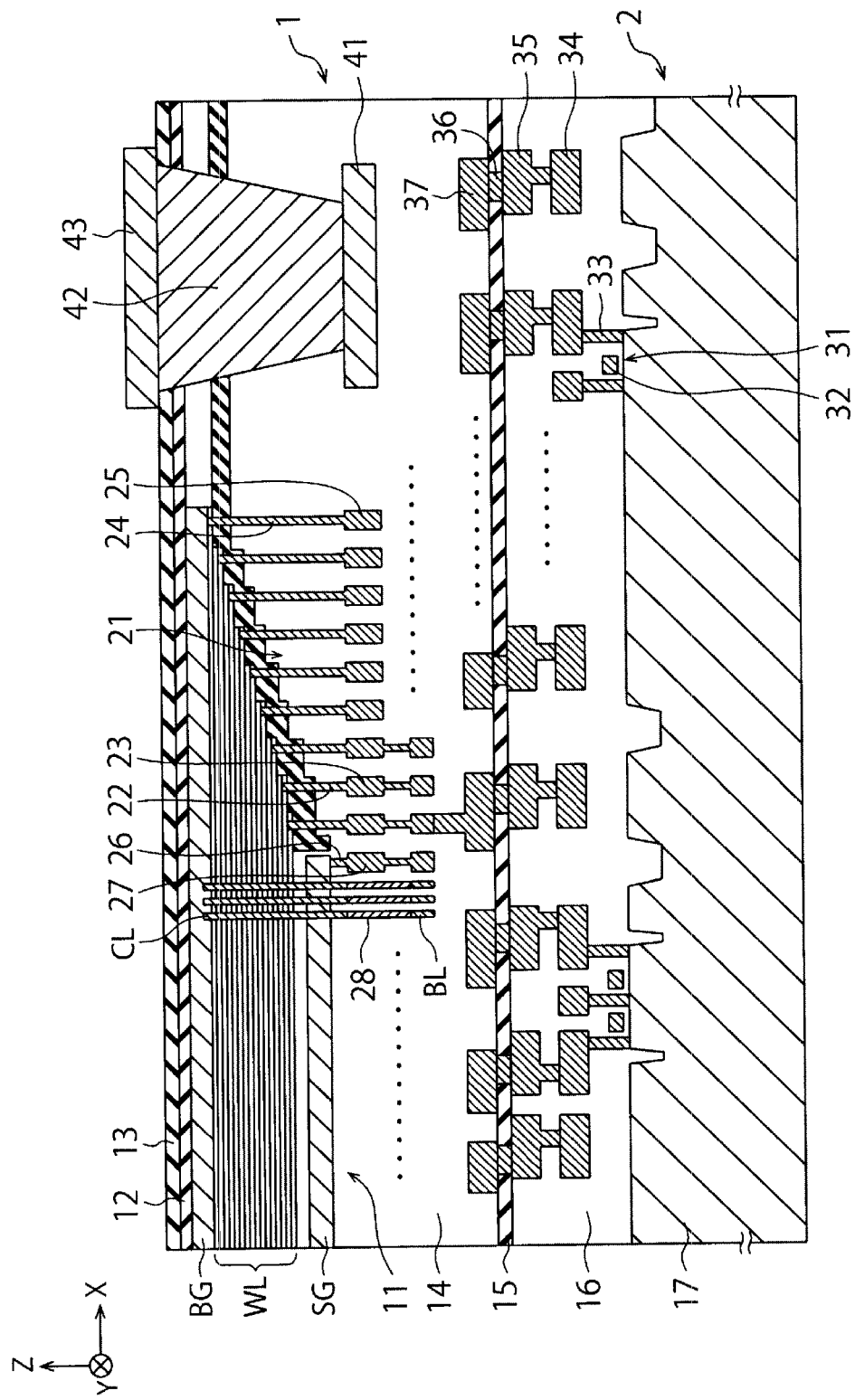
FIG. 1 is a sectional view depicting the structure of a semiconductor device of a first embodiment.

FIG. 1 is a sectional view depicting the structure of a semiconductor device of a first embodiment. The semiconductor device of FIG. 1 is a three-dimensional memory formed of an array chip 1 and a circuit chip 2 which are bonded together.

The array chip 1 includes a memory cell array 11 including a plurality of memory cells, an insulating layer 12 (e.g., a silicon nitride film) on the memory cell array 11, an insulating layer 13 (e.g., a silicon oxide film) on the insulating layer 12, and an interlayer insulating film 14 below the memory cell array 11.

The circuit chip 2 is provided below the array chip 1 with an insulating layer 15 placed therebetween. The circuit chip 2 include an interlayer insulating film 16 and a substrate 17 below the interlayer insulating film 16. The substrate 17 is, for example, a semiconductor substrate such as a silicon substrate. FIG. 1 shows an X direction and a Y direction which are parallel to the front surface of the substrate 17 and are perpendicular to each other and a Z direction perpendicular to the front surface of the substrate 17. In the present specification, a +Z direction is treated as an upper direction and a −Z direction is treated as a lower direction; however, the −Z direction may or may not coincide with the direction of gravity.

The array chip 1 includes, as an electrode layer inside the memory cell array 11, a plurality of word lines WL, a back gate BG, and a selection gate SG. FIG. 1 depicts a step structure portion 21 of the memory cell array 11. As depicted in FIG. 1, each word line WL is electrically connected to a word wiring layer 23 via a contact plug 22, the back gate BG is electrically connected to a back gate wiring layer 25 via a contact plug 24, and the selection gate SG is electrically connected to a selection gate wiring layer 27 via a contact plug 26. A columnar portion CL passing through the word lines WL, the back gate BG, and the selection gate SG is electrically connected to a bit line BL via a plug 28.

The circuit chip 2 includes a plurality of transistors 31. Each transistor 31 includes a gate electrode 32 provided on the substrate 17 with a gate insulating film placed therebetween and unillustrated source diffusion layer and drain diffusion layer provided in the substrate 17. The circuit chip 2 further includes a plurality of plugs 33 provided on the source diffusion layers or the drain diffusion layers of these transistors 31, a wiring layer 34 which is provided on these plugs 33 and includes a plurality of wiring lines, and a wiring layer 35 which is provided on the wiring layer 34 and includes a plurality of wiring lines. A plurality of metal pads 36 provided in the insulating layer 15 are provided on the wiring layer 35. The array chip 1 includes a wiring layer 37 which is provided on these metal pads 36 and includes a plurality of wiring lines. Each word line WL of the present embodiment is electrically connected to the wiring layer 37.

The array chip 1 further includes a pad 41 electrically connected to the wiring layer 37 via an unillustrated via plug, an external connection electrode 42 provided on the pad 41, and an external connection pad 43 provided on the external connection electrode 42. The external connection pad 43 is connectable to amounting substrate and another device via a solder ball, a metal bump, a bonding wire, or the like.

Figure 2:
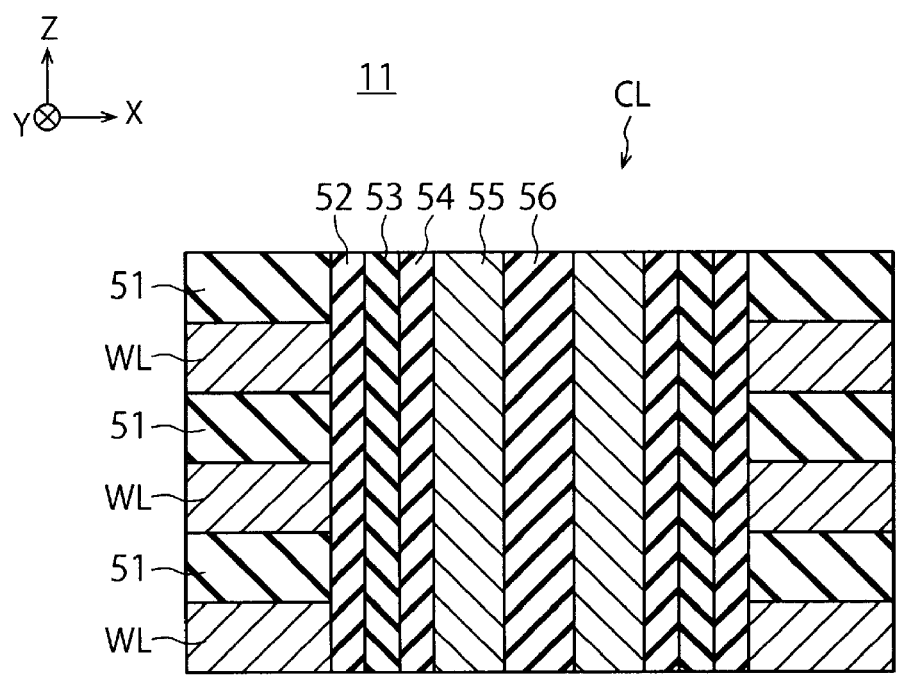
FIG. 2 is a sectional view depicting the structure of a columnar portion of the first embodiment.

FIG. 2 is a sectional view depicting the structure of the columnar portion CL of the first embodiment.

As depicted in FIG. 2, the memory cell array 11 includes a plurality of word lines WL and a plurality of insulating layers 51, which are alternately stacked on the interlayer insulating film 14. Each word line WL is, for example, a tungsten (W) layer. Each insulating layer 51 is, for example, a silicon oxide film.

The columnar portion CL includes a block insulating film 52, a charge storage layer 53, a tunnel insulating film 54, a channel semiconductor layer 55, and a core insulating film 56. The charge storage layer 53 is, for instance, a silicon nitride film and is formed on the side surface of the word lines WL and the insulating layers 51 with the block insulating film 52 placed therebetween. The channel semiconductor layer 55 is, for instance, a silicon layer and is formed on the side surface of the charge storage layer 53 with the tunnel insulating film 54 placed therebetween. Examples of the block insulating film 52, the tunnel insulating film 54, and the core insulating film 56 are a silicon oxide film and a metal insulating film.

Figure 3:
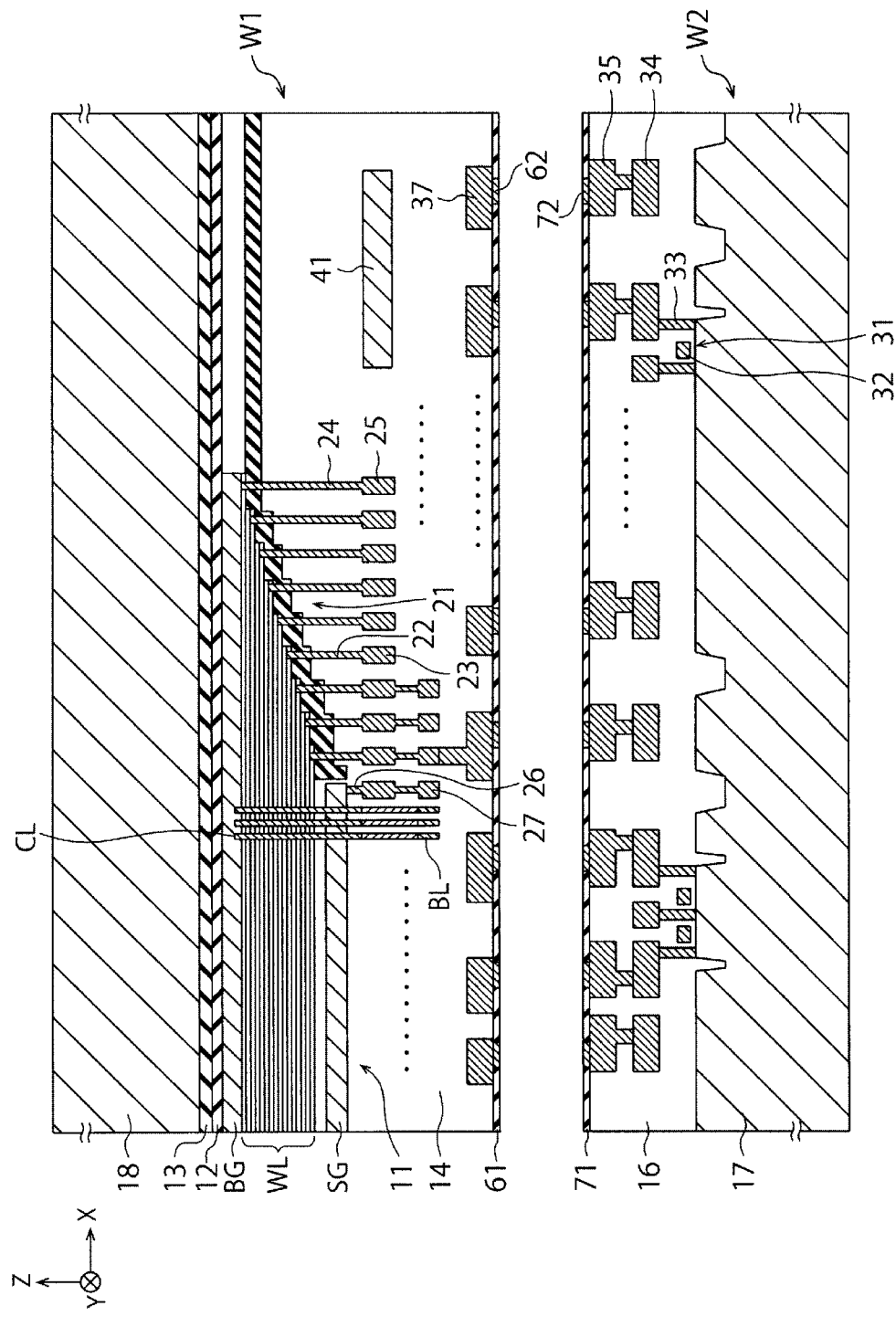
FIG. 3 is a sectional view showing a semiconductor device production method of the first embodiment.

FIG. 3 is a sectional view showing a semiconductor device production method of the first embodiment.

FIG. 3 shows an array wafer W1 including a plurality of array chips 1 and a circuit wafer W2 including a plurality of circuit chips 2. FIG. 3 further shows a first insulating layer 61 and a plurality of first metal pads 62, which are provided on the lower surface of the array wafer W1, and a second insulating layer 71 and a plurality of second metal pads 72, which are provided on the upper surface of the circuit wafer W2. Each first metal pad 62 is provided on the lower surface of the wiring layer 37, and each second metal pad 72 is provided on the upper surface of the wiring layer 35. Moreover, the array wafer W1 includes a substrate 18 on the insulating layer 13.

In FIG. 3, the first insulating layer 61 is formed on the lower surface of the interlayer insulating film 14; alternatively, the first insulating layer 61 may be integrated with the interlayer insulating film 14 by being included therein. Likewise, in FIG. 3, the second insulating layer 71 is formed on the upper surface of the interlayer insulating film 16; alternatively, the second insulating layer 71 may be integrated with the interlayer insulating film 16 by being included therein.

First, the array wafer W1 and the circuit wafer W2 are bonded together by mechanical pressure. As a result, the first insulating layer 61 and the second insulating layer 71 are made to adhere to each other and the insulating layer 15 is formed. Next, the array wafer W1 and the circuit wafer W2 are annealed. As a result, the first metal pad 62 and the second metal pad 72 are joined together and a plurality of metal pads 36 are formed.

Then, the substrate 18 is removed by chemical mechanical polishing (CMP) or wet etching, and the array wafer W1 and the circuit wafer W2 are cut into a plurality of chips. In this way, the semiconductor device of FIG. 1 is produced. The external connection electrode 42 and the external connection pad 43 are formed on the pad 41 after the removal of the substrate 18, for example.

In the present embodiment, the array wafer W1 and the circuit wafer W2 are bonded together; instead, the array wafers W1 may be bonded together. The above description given with reference to FIGS. 1 to 3 and the description which will be given below with reference to FIGS. 4A to 8 may also be applied to bonding of the array wafers W1. The array wafer W1 is also called a memory wafer, and the circuit wafer W2 is also called a CMOS wafer.

FIGS. 4A and 4B and FIGS. 5A and 5B are sectional views showing the details of the semiconductor device production method of the first embodiment.

Figure 4A:
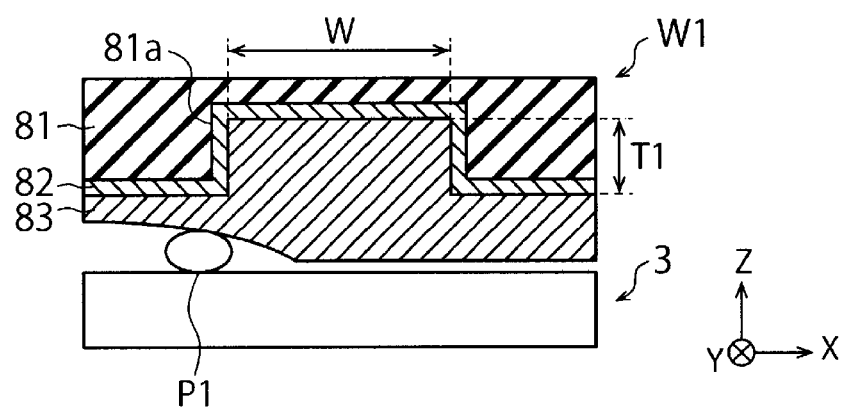
FIGS. 4A and 4B are sectional views (1/2) showing the details of the semiconductor device production method of the first embodiment.

FIG. 4A depicts the array wafer W1 as in the case of FIG. 3. The array wafer W1 includes an insulating film 81 with a recess portion 81a, a barrier metal layer 82, and a wiring material layer 83. The insulating film 81 is an example of a first insulating film, and the recess portion 81a is an example of a first recess portion. The wiring material layer 83 is an example of a first conductive layer, and the barrier metal layer 82 is an example of another conductive layer. Moreover, the substrate 18 is an example of a first substrate.

The insulating film 81 corresponds to the above-described interlayer insulating film 14 and first insulating layer 61 and is, for instance, a silicon oxide film (a $SiO_2$ film). The recess portion 81a is formed in the insulating film 81 and has a square or rectangular planar shape, for example. The barrier metal layer 82 is, for instance, a titanium (Ti) layer and is formed on the front surface of the insulating film 81 located inside and outside the recess portion 81a. The wiring material layer 83 is, for example, a copper (Cu) layer and is formed on the front surface of the insulating film 81, which is located inside and outside the recess portion 81a, with the barrier metal layer 82 placed therebetween. The wiring material layer 83 is used to form the first metal pad 62. The first metal pad 62 is an example of a first pad.

A sign W denotes the width of the wiring material layer 83 located inside the recess portion 81a, and a sign T1 denotes the thickness of the wiring material layer 83 located inside the recess portion 81a. The width W is 3 μm or less, for example. The planar shape of the wiring material layer 83 located inside the recess portion 81a is, for instance, a square or rectangle, and the width W is the length of one side of the square or the length of a short side or a long side of the rectangle. In the present embodiment, the planar shape of the wiring material layer 83 located inside the recess portion 81a is a square with sides, each being 3 μm or less in length, or a rectangle with short sides and long sides, each being 3 μm or less in length.

The structure depicted in FIG. 4A is formed in the following manner. First, the insulating film 81 is formed on the substrate 18, and the recess portion 81a is formed in the insulating film 81. Next, on the front surface of the insulating film 81 located inside and outside the recess portion 81a, the barrier metal layer 82 and the wiring material layer 83 are formed in order. Then, in the present embodiment, first and second processes of polishing the insulating film 81, the barrier metal layer 82, and the wiring material layer 83 by CMP are executed. Hereinafter, the details of the first and second processes will be described.

First, the first process of polishing the wiring material layer 83 at a high polishing rate is performed (FIG. 4A). This polishing rate is an example of a first polishing rate. FIG. 4A shows a polishing pad 3 that polishes the wiring material layer 83 and abrasive grain P1 contained in slurry for polishing the wiring material layer 83. In the first process, the barrier metal layer 82 is also polished.

Figure 4B:
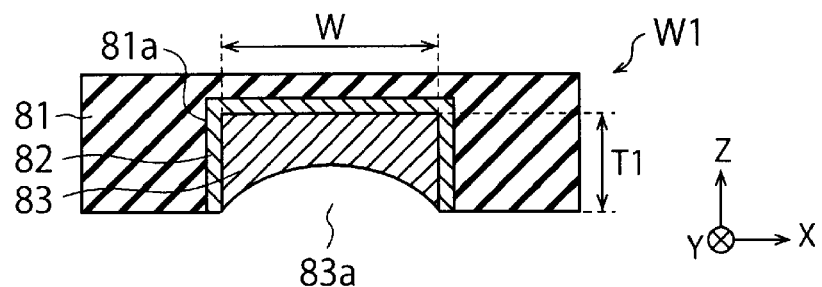

The first process is continued until the front surface of the insulating film 81 is exposed from the barrier metal layer 82 as depicted in FIG. 4B. With the first process, by polishing the wiring material layer 83 at a high polishing rate, it is possible to remove the wiring material layer 83 outside the recess portion 81a in a short time. The first process may be ended shortly before the insulating film 81 is exposed from the barrier metal layer 82 or may be ended shortly after the insulating film 81 is exposed from the barrier metal layer 82.

As a result of the first process, dishing 83a may occur in the front surface of the wiring material layer 83 as depicted in FIG. 4B. There is a possibility that, if the size of the dishing 83a is large, the first metal pad 62 is not properly joined to the second metal pad 72.

Next, the second process of polishing the wiring material layer 83 at a low polishing rate is performed (FIG. 5A). This polishing rate is an example of a second polishing rate which is lower than the first polishing rate. FIG. 5A shows the above-described polishing pad 3 that polishes the wiring material layer 83 and abrasive grain P2 contained in slurry for polishing the wiring material layer 83. In the second process of the present embodiment, slurry which is different from the slurry used in the first process is used and, for example, alkaline slurry is used. In the second process, the barrier metal layer 82 and the insulating film 81 are also polished.

The second process is performed to reduce the size of the dishing 83a of the wiring material layer 83 as depicted in FIG. 5B. FIG. 5B shows a state in which the thickness of the wiring material layer 83 located inside the recess portion 81a is reduced to T2 from T1. Polishing in the second process of the present embodiment is performed in such a way that the selection ratio of the wiring material layer 83 to the insulating film 81 is 0.3 to 0.4. For example, the second process may be started shortly before the insulating film 81 is exposed from the barrier metal layer 82 or may be started shortly after the insulating film 81 is exposed from the barrier metal layer 82.

With the second process, as depicted in FIG. 5B, the first metal pad 62 which is formed of the wiring material layer 83 and has a width W is formed inside the recess portion 81a. The width W of the first metal pad 62 is 3 μm or less, for example. The planar shape of the first metal pad 62 is, for instance, a square or rectangle, and the width W is the length of one side of the square or the length of a short side or a long side of the rectangle. In the present embodiment, the planar shape of the first metal pad 62 is a square with sides, each being 3 μm or less in length, or a rectangle with short sides and long sides, each being 3 μm or less in length.

In the present embodiment, the second metal pad 72 of the circuit wafer W2 is also formed by the procedures of FIGS. 4A to 5B. Specifically, a second insulating film, a second recess portion, a conductive layer, and a second conductive layer which are similar to the insulating film 81 (the first insulating film), the recess portion 81a (the first recess portion), the barrier metal layer 82 (the conductive layer), and the wiring material layer 83 (the first conductive layer) are formed, a third process similar to the first process is performed at a high polishing rate (a third polishing rate), and a fourth process similar to the second process is performed at a low polishing rate (a fourth polishing rate). The second metal pad 72 is an example of a second pad, and the substrate 17 is an example of a second substrate. In the present embodiment, the planar shape of the second metal pad 72 is identical to the planar shape of the first metal pad 62 and is a square with sides, each being 3 μm or less in length, or a rectangle with short sides and long sides, each being 3 μm or less in length.

Then, the first insulating layer 61 and the second insulating layer 71 are made to adhere to each other and the insulating layer 15 is formed, and the first metal pad 62 and the second metal pad 72 are joined together and the metal pad 36 is formed. In this way, the array wafer W1 and the circuit wafer W2 are bonded together and the semiconductor device of FIG. 1 is produced.

The following is a supplementary explanation of bonding of the array wafer W1 and the circuit wafer W2.

In order to bond the array wafer W1 and the circuit wafer W2 together, bonding (joining together) of the first metal pad 62 and the second metal pad 72, which are Cu layers, and bonding of (adhesion between) the first insulating layer 61 and the second insulating layer 71, which are $SiO_2$ films, are needed.

For this reason, in the present embodiment, after the execution of the first to fourth processes, the front surfaces of the first and second insulating layers 61 and 71 are irradiated with nitrogen ($N_2$) plasma and a dangling bond is formed on the front surfaces of the first and second insulating layers 61 and 71. Next, by performing megasonic cleaning of the first and second insulating layers 61 and 71, the OH group (hydroxyl group) is formed on the front surfaces of the first and second insulating layers 61 and 71. Next, by bonding the array wafer W1 and the circuit wafer W2 together by using a pressure mechanism, the hydrogen bond on the front surfaces of the first and second insulating layers 61 and 71 is made to progress.

Then, the array wafer W1 and the circuit wafer W2 are annealed at 200 to 300° C. The water generated by this annealing diffuses into the first and second insulating layers 61 and 71 and forms the $SiO_2$ bond between the first insulating layer 61 and the second insulating layer 71. On the other hand, as a result of the first and second metal pads 62 and 72 expanding and being thermally melted by this annealing, the metallic bond is generated between the first metal pad 62 and the second metal pad 72.

If projections and depressions remain in the front surfaces of the array wafer W1 and the circuit wafer W2 at the time of this annealing, the hydrogen bond of the first insulating layer 61 and the second insulating layer 71 does not sufficiently progress, which may cause a void between the first insulating layer 61 and the second insulating layer 71. Moreover, if the size of dishing of the first and second metal pads 62 and 72 is large, the first metal pad 62 and the second metal pad 72 do not make adequate contact with each other, which may result in insufficient metallic bond. Thus, the present embodiment deals with these problems by polishing the front surfaces of the array wafer W1 and the circuit wafer W2 by the first to fourth processes.

Hereinafter, the further details of the first and second processes will be described with reference to FIGS. 4A to 5B. In the following description, FIGS. 6 to 8 will also be referred to as appropriate. The following description may also be similarly applied to the third and fourth processes.

In the first process, in order to remove the extra wiring material layer 83 located outside the recess portion 81a, the wiring material layer 83 is removed at high speed by using slurry that polishes the wiring material layer 83 at a high polishing rate and stops polishing at the insulating film 81. At this time, it is desirable to set the polishing rate of the barrier metal layer 82 at a polishing rate equal to the polishing rate of the wiring material layer 83 or at a polishing rate which is slightly higher than the polishing rate of the wiring material layer 83. The barrier metal layer 82 is, for example, a Ti layer; the barrier metal layer 82 may be other metal layers (for example, a tantalum (Ta) layer).

The array wafer W1 includes a plurality of recess portions 81a in which a plurality of first metal pads 62 are to be embedded. With the first process, erosion may occur due to a difference in occupancy of the wiring material layer 83 between the recess portions 81a and dishing 83a of various shapes may occur due to a difference in the width W between the recess portions 81a. The second process of the present embodiment is performed to reduce such erosion and dishing 83a.

Here, assume that the second process is performed in such a way that the selection ratio of the wiring material layer 83 to the insulating film 81 is 1. When the selection ratio is 1, the insulating film 81 and the wiring material layer 83 are polished at the same polishing rate. However, it has been found that, if the selection ratio is set at 1, it is impossible to reduce the erosion and dishing 83a sufficiently, which causes, at the time of bonding of the array wafer W1, a void in the insulating film 81 or a situation in which the wiring material layer 83 is not joined. Therefore, it is not preferable to set the selection ratio at 1.

Thus, in the present embodiment, the second process is performed in such a way that the selection ratio of the wiring material layer 83 to the insulating film 81 is 0.3 to 0.4. It is made clear that this makes it possible to reduce the erosion and dishing 83a sufficiently.

FIG. 6 is a table for explaining the semiconductor device production method of the first embodiment.

FIG. 6 shows changes in the amount of dishing and the bonding area when the selection ratio of the wiring material layer 83 to the insulating film 81 is changed. The amount of dishing means the depth of the dishing 83a; the amount of dishing when the dishing 83a is concave is expressed as a positive number and the amount of dishing when the dishing 83a is convex is expressed as a negative number. The bonding area indicates the area in which the first metal pad 62 and the second metal pad 72 are properly joined together. The planar shape of the first metal pad 62 and the second metal pad 72 is a square with sides, each being 3 μm in length.

When the amount of dishing is a positive number, the central region of the lower surface of the wiring material layer 83 is located above the level of the outer region of the lower surface of the wiring material layer 83 and the lower surface of the wiring material layer 83 has a shape projecting in the upper direction. On the other hand, when the amount of dishing is a negative number, the central region of the lower surface of the wiring material layer 83 is located below the level of the outer region of the lower surface of the wiring material layer 83 and the lower surface of the wiring material layer 83 has a shape projecting in the lower direction. In general, dishing refers to a shape projecting in the upper direction like the former lower surface. However, in this description, to treat the former lower surface and the latter lower surface uniformly, a shape projecting in the lower direction like the latter lower surface is also referred to as dishing.

It is clear from FIG. 6 that, while the selection ratio is reduced from 0.77 to 0.37, the amount of dishing is reduced with a reduction in the selection ratio; however, while the selection ratio is reduced from 0.37 to 0.27, convex dishing 83a starts to occur. On the other hand, the bonding area increases with a reduction in the selection ratio and is nearly saturated when the selection ratio is reduced to 0.37. Thus, the bonding area when the selection ratio is 0.27 is almost the same as the bonding area when the selection ratio is 0.37.

If the selection ratio is 0.27, when the amount of polishing of the insulating film 81 reaches 50 nm, convex dishing 83a starts to occur. In this case, although it is possible to sufficiently prevent a situation in which the wiring material layer 83 is not joined, it is impossible to prevent a void in the insulating film sufficiently. Thus, it is not desirable to reduce the selection ratio to 0.27, and it is desirable that the selection ratio is set at about 0.37. For this reason, the selection ratio of the present embodiment is set within the range of 0.3 to 0.4. This range is determined so that the selection ratio is set at about 0.37 in a region which is higher than 0.27 and lower than 0.54 shown in FIG. 6.

Figures 7, 8:
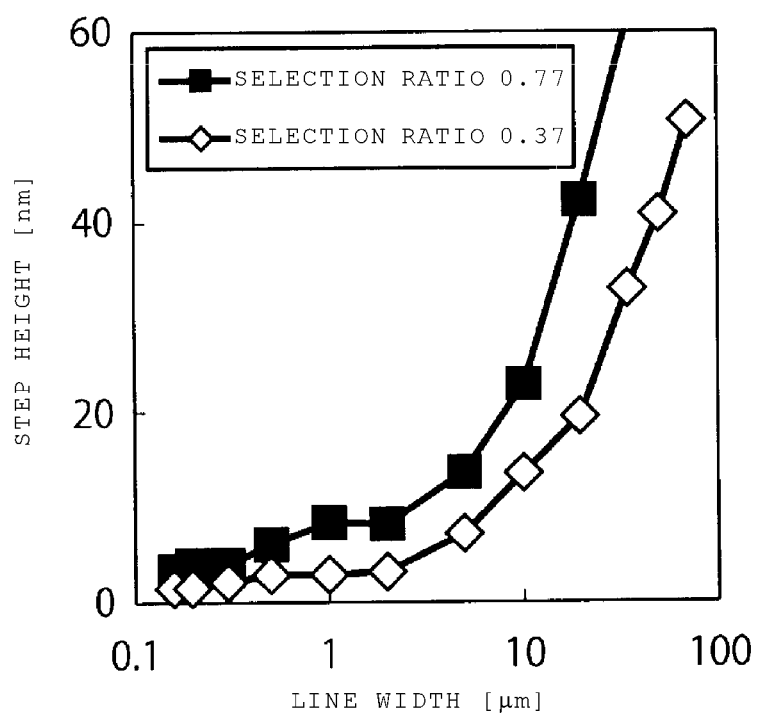
FIG. 7 is a graph for explaining the semiconductor device production method of the first embodiment.
FIG. 8 is a table for explaining the semiconductor device production method of the first embodiment.

FIG. 7 is a graph for explaining the semiconductor device production method of the first embodiment.

FIG. 7 shows the relationship between the line width and the step height in a case where the selection ratio is 0.77 and a case where the selection ratio is 0.37. The step height on the vertical axis represents the above-described amount of dishing. The line width on the horizontal axis represents the width W of the first metal pad 62. The planar shape of the first metal pad 62 in this case is a square and the width W represents the length of one side of the square.

It is clear from FIG. 7 that, when the selection ratio is 0.37 and the width W is 3 μm or less, the step height (i.e., the amount of dishing) can be maintained at 0 to 3 nm. Thus, when the first and second processes of the present embodiment are applied to a case where the width W is 3 μm or less, it is possible to reduce the dishing 83a sufficiently by setting the selection ratio at 0.3 to 0.4.

FIG. 8 is a table for explaining the semiconductor device production method of the first embodiment.

FIG. 8 shows the occurrence of a void when acidic slurry is used as the slurry of the second process and the occurrence of a void when alkaline slurry is used as the slurry of the second process. The pH of the slurry in the former case is 2 to 3, and the pH of the slurry in the latter case is 11 to 12. In the former case, although $N_2$ plasma treatment and megasonic cleaning are performed in a manner similar to the latter case, a void occurs.

It is clear from FIG. 8 that it is possible to prevent the occurrence of a void by using alkaline slurry in the second process. The reason is as follows. By using alkaline slurry in the second process, it is possible to make the OH group actively adhere to the front surface of the insulating film 81 subjected to polishing. As a result, the OH group needed at the time of bonding is sufficiently supplied to the front surface of the insulating film 81, which makes it possible to form good hydrogen bond in the insulating film 81.

The second process of the present embodiment may be performed with the temperature of the polishing pad 3 being adjusted by a temperature adjusting section. The reason is as follows.

In the second process, the temperature of a polishing table holding the polishing pad 3 increases with the progress of polishing. Then, when the temperature of the polishing table reaches a given level, the temperature of the polishing table is saturated. However, this saturated temperature varies by about 5° C. depending on the state of the polishing pad 3, the state of a consumable member of a dresser for the polishing pad 3, the temperature of the slurry, and the like.

On the other hand, it has been found that the above temperature variations can cause variations in the temperature of the polishing pad 3 and in the selection ratio in the second process. When the selection ratio varies, the amount of dishing and the bonding area change as shown in FIG. 6. Thus, it is desirable to stabilize the temperature of the polishing pad 3.

For this reason, in the present embodiment, the temperature of the polishing pad 3 may be controlled by the temperature adjusting section so that the temperature of the polishing pad 3 becomes constant by sensing the temperature of the polishing pad 3 by a sensor. Examples of the temperature adjusting section are a heater and a cooler. For instance, the temperature adjusting section may heat the polishing pad 3 by turning on the heater and cool the polishing pad 3 by turning off the heater. Alternatively, the temperature adjusting section may heat the polishing pad 3 by turning on the heater and cool the polishing pad 3 by turning on the cooler. This makes it possible to maintain the temperature of the polishing pad 3 at a fixed value or within a fixed range and maintain the selection ratio at a fixed value or within a fixed range.

Moreover, as described with reference to FIG. 3 and FIGS. 4A to 5B, after the array wafer W1 and the circuit wafer W2 are bonded together, the array wafer W1 and the circuit wafer W2 are annealed in the present embodiment. As a result, the first metal pad 62 and the second metal pad 72 are joined together and a plurality of metal pads 36 are formed. Here, if the barrier metal layer 82 is a Ti layer, it is desirable to reduce the size of the dishing 83a by limiting the temperature of this annealing to 300° C. or lower.

As described above, in the present embodiment, the first process of polishing the wiring material layer 83 at a high rate and the second process of polishing the wiring material layer 83 at a low rate after the first process are performed, and the second process is performed in such a way that the selection ratio of the wiring material layer 83 to the insulating film 81 is 0.3 to 0.4. Thus, according to the present embodiment, it is possible to properly bond the first metal pad 62 and the second metal pad 72 together and properly bond the first insulating layer 61 and the second insulating layer 71 together.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device production method comprising:
   forming a first recess portion in a first insulating film formed on a first substrate;
   forming a first conductive layer on a front surface of the first insulating film located both inside and outside the first recess portion;
   forming, in the first recess portion, a first pad having a width equal to or less than 3 μm and equal to or greater than 1.5 μm and including the first conductive layer by performing a first process of polishing the first conductive layer at a first polishing rate and, after the first process, a second process of polishing the first conductive layer at a second polishing rate which is lower than the first polishing rate, wherein the second process is performed such that a selection ratio of the first conductive layer to the first insulating film is 0.3 to 0.4;
   joining the first pad of the first substrate and a second pad of a second substrate together by annealing the first substrate and the second substrate; and
   forming the first conductive layer on the front surface of the first insulating film, which is located both inside and outside the first recess portion and having another conductive layer placed therebetween.

2. The semiconductor device production method according to claim 1, wherein the first conductive layer contains copper.

3. The semiconductor device production method according to claim 1, wherein the another conductive layer contains titanium.

4. The semiconductor device production method according to claim 1, wherein joining the first pad of the first substrate and the second pad of the second substrate together by the annealing the first substrate and the second substrate comprises annealing the first substrate and the second substrate at a temperature between 200° C. and 300° C., inclusive.

5. The semiconductor device production method according to claim 1, wherein the second process is performed by using a second slurry which is different from a first slurry used in the first process.

6. The semiconductor device production method according to claim 1, wherein the second process is performed by using alkaline slurry.

7. The semiconductor device production method according to claim 1, wherein a planar shape of the first pad is a square or rectangle with sides each being 3 μm or less in length.

8. The semiconductor device production method according to claim 1, wherein a planar shape of the second pad is identical to the planar shape of the first pad.

9. The semiconductor device production method according to claim 1, further comprising:
   forming a second recess portion in a second insulating film formed on the second substrate;
   forming a second conductive layer on a front surface of the second insulating film located both inside and outside the second recess portion; and
   forming, in the second recess portion, the second pad having a width of 3 μm or less and including the second conductive layer by performing a third process of polishing the second conductive layer at a third polishing rate and, after the third process, a fourth process of polishing the second conductive layer at a fourth polishing rate which is lower than the third polishing rate,
   wherein the fourth process is performed such that a selection ratio of the second insulating film to the second conductive layer is 0.3 to 0.4.

10. The semiconductor device production method according to claim 1, wherein the selection ratio of the first conductive layer to the first insulating film is 0.35 to 0.39.

* * * * *